Inventor
John T. Corsiglia
By Merriam, Smith & Marshall
Attorneys

Inventor
John T. Corsiglia
By Merriam, Smith & Marshall
attorneys

March 2, 1965 J. T. CORSIGLIA 3,171,979

SQUARING AMPLIFIER CIRCUIT INCLUDING TWO TRANSISTORS WITH SERIES RESISTOR AND TUNNEL DIODE COMBINATION CONNECTED THEREBETWEEN

Filed March 13, 1962 3 Sheets-Sheet 3

Inventor
John T. Corsiglia
By Merriam, Smith & Marshall
Attorneys

United States Patent Office 3,171,979

Patented Mar. 2, 1965

3,171,979
SQUARING AMPLIFIER CIRCUIT INCLUDING TWO TRANSISTORS WITH SERIES RESISTOR AND TUNNEL DIODE COMBINATION CONNECTED THEREBETWEEN

John T. Corsiglia, Anaheim, Calif., assignor to Interstate Electronics Corporation, Anaheim, Calif., a corporation of California Filed Mar. 13, 1962, Ser. No. 179,314
3 Claims. (Cl. 307—88.5)

Figure 1:
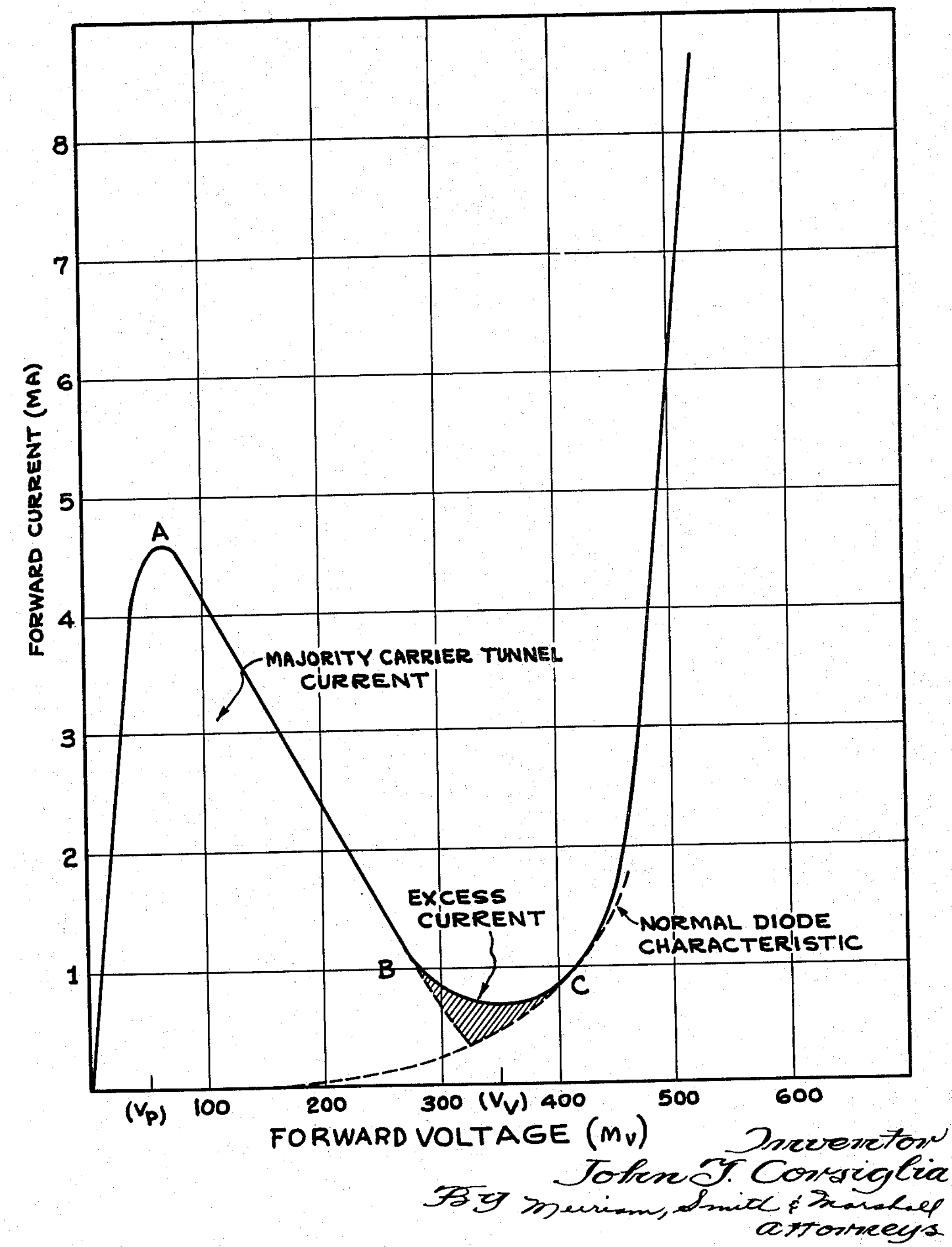

This invention relates to electric circuits of a character particularly useful for developing rectangular shaped wave outputs under the control of applied signaling waves.

In its broadest applications, the invention may be regarded as a switching element which performs the requirements of a triggering circuit. The described circuit thus serves to transform signaling inputs of varying wave shapes into signal outputs of which the waves are essentially rectangularly shaped. The wave forms produced have extremely rapid rise and fall times. The time duration between the rise and fall periods is accordingly illustrative and representative of the time within which the control wave exceeds the pre-established amplitude value.

The circuitry to be described functions to provide results resembling in many respects the output wave characteristics achieved from circuits which are known as the "Schmitt trigger." Circuits of this type find wide usage in analog-to-digital conversion, in restoring binary levels from a deteriorated binary input, and for squaring sinusoidal saw-tooth or other irregular wave shapes. Output signals which result when so considered are generally of the inverted form of a binary input signal although the reverse form wave is readily achieved when desired. While in many instances the described circuitry is intended for D.C. output coupling, minor circuit changes may be utilized to provide an A.C. output while maintaining circuit utility as a triggering source.

One form of circuit by which the invention may be practiced is one where input signals are supplied to a transistor which is directly coupled to a second amplifying transistor which has a so-called tunnel diode element connected across its input. The circuit arrangement is one which has an extremely high input impedance, but which also has a very low impedance output. The circuit is made compatible because of the tunnel diode component therewith included, the tunnel diode having a negative resistance characteristic during a portion of its normal operation.

When recourse is had to the general theory of atomic physics, the broad type of operation of the tunnel diode may be more readily appreciated. Illustrative of one of the texts which discusses the problems of measuring the potential and kinetic energy which is possessed by the electrons in the atoms and elements, is the publication entitled "Transistor Electronics" by Lo, Endres, Zawels, Waldhauer and Cheng, which was published by Prentice Hall in 1955, and to which reference may here be made for the theoretical background of operation of the tunnel diode component.

It is known that, in connection with the junction diodes, there are many types of circuit components and the components can be formed in various ways. It is important that the component shall be of a variety which has what is generally known as relatively low leakage. The tunnel diode, without attempting to discuss in full its theoretical operation, nonetheless may be generally looked upon as being a component whose name was derived from the operating results of quantum physics because, when using the structure, one learns that a particle can disappear, as it were, from one side of a potential barrier (even though it does not have enough energy to surmount the barrier) and tunnel beneath the barrier, after which it can make its appearance on the other side of the barrier. The potential barrier is formed by a space charge depletion in the region of the p-n junction. In components which will here be under consideration, this junction is made extremely thin so that penetration by means of the tunnel effect can readily be achieved. The result is generally that, as a result of the extremely small junction thickness, the forward current in the diode tends to reduce with an increase in the forward bias. The peak current occurs with a very small forward bias. A negative resistance region accordingly results. High concentrations of free carriers are used in the semiconductor crystal. Then, as the density of the charge carriers is increased, the reverse breakdown voltage decreases. This establishes a very low reverse breakdown voltage for the component.

Following these principles, the invention herein to be set forth and described makes use of the foregoing type of operation and the result is the achievement of a squaring amplifier component responsive to the amplitude of the input signals, with the response occurring at extremely broad repetition rates.

Figure 2:
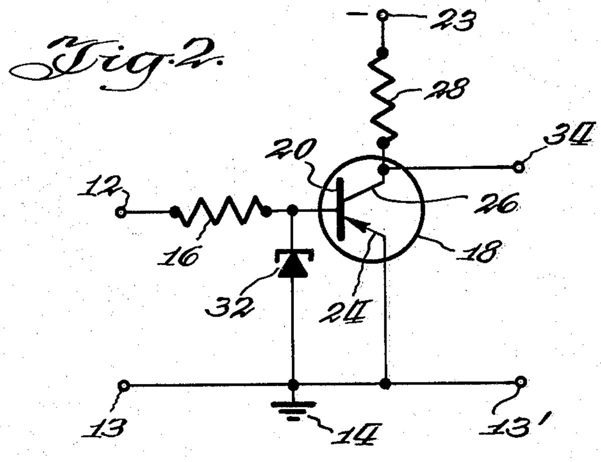
Figure 3:
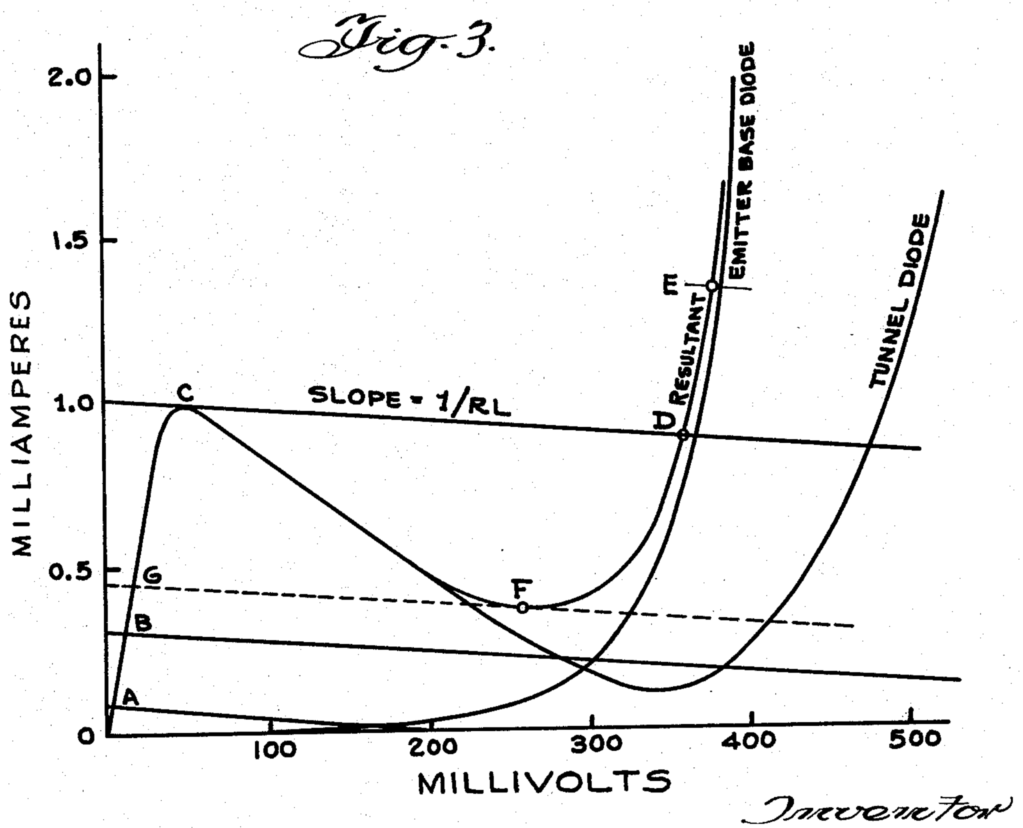
Figure 5:
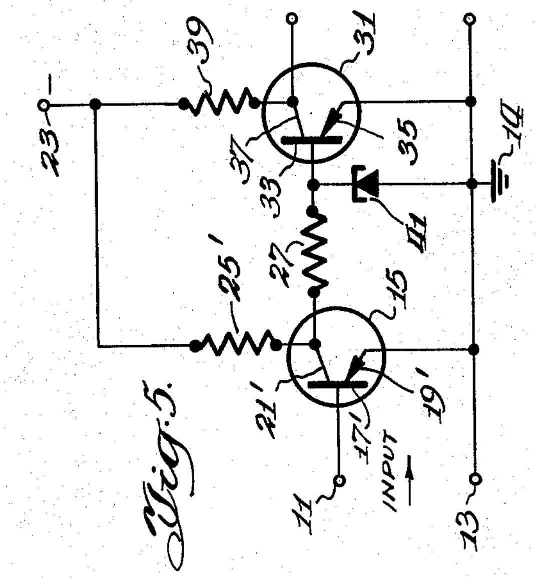
Figure 7:
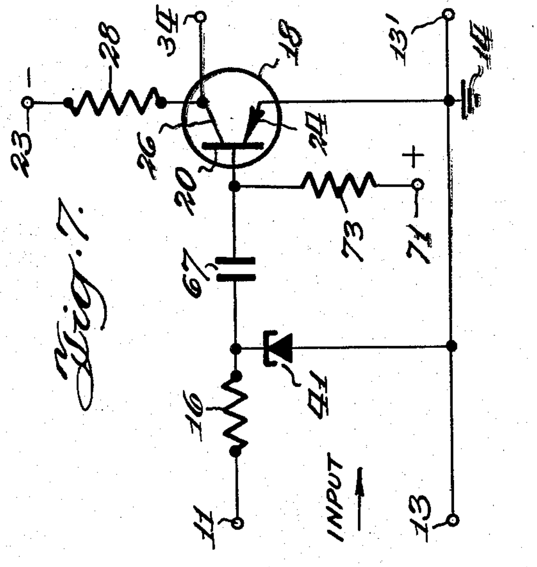
Figure 4:
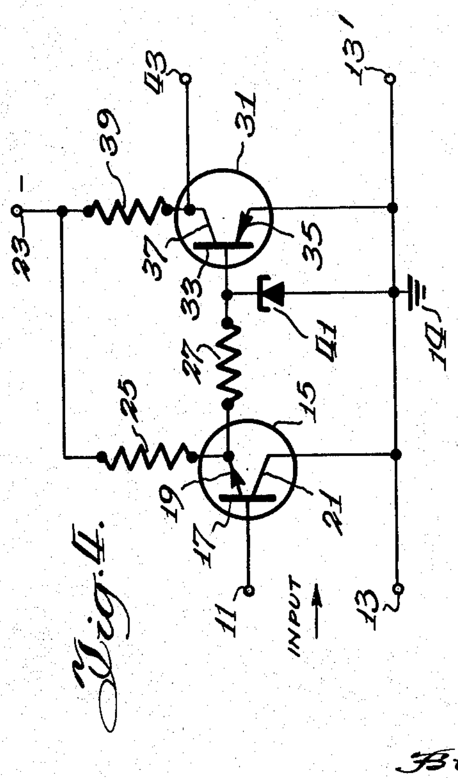
Figure 6:
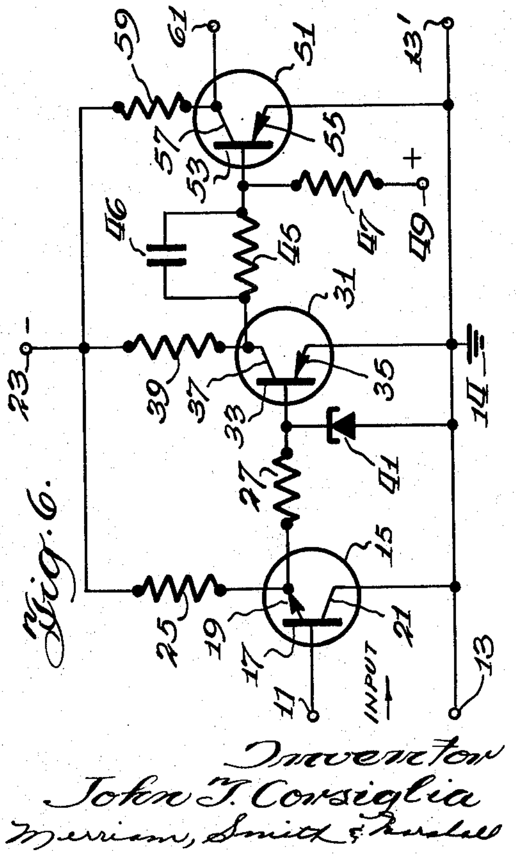

The invention has been illustrated in certain of its preferred and simple diagrammatic forms in combination with transistor circuit elements and connections, with the broad operating principles of the device being exemplified by the drawing curves. By the drawings, FIG. 1 sets out broadly a typical characteristic curve of a tunnel diode; FIG. 2 is a schematic diagram to illustrate broadly the operational principle of the circuit arrangements to be described; FIG. 3 is a typical curve to represent the input characteristic of the combined circuit elements; FIG. 4 is a schematic diagram to show a multi-stage operating circuit illustrating the principles of the described invention, wherein the first stage is connected as an emitter-follower to provide a high input impedance and to supply signals to the next operating stage across the input of which a tunnel diode is connected; FIG. 5 is a modified form of circuit for which the first transistor stage is connected to provide amplification and inversion; FIG. 6 is a circuit generally similar to that of FIG. 4, with a further inverting and amplifying stage connected to the second transistor element; and, FIG. 7 is a further modification showing the input signal to the second transistor stage A.C. coupled.

Reference may now be made to the accompanying drawings for a further understanding of the principles of the invention.

Considering first FIG. 1, a typical characteristic curve of a tunnel diode of the type known as 1N2941 is illustrated. In this curve, the forward current (in milliamperes) of the diode is plotted as the ordinate with the forward voltage (in millivolts) as the abscissa. The curve shows clearly that the forward current rises rapidly and substantially linearly to a point generally designated as A, which represents a peak, after which the characteristic slopes downwardly to a point B with the portion beneath the curve generally designated as the majority carrier tunnel current. At the point B the curve changes according to a curved characteristic to the point C, after which, with an increase in forward voltage, the current flow increases rapidly. The minimum dip in the curve is known commonly as the valley voltage point. In the lower voltage region, below the peak voltage, and in the reverse biased condition, the diode current consists of minority carriers which tunnel through the p–n junction in the fashion above explained.

In the linear forward conductance region existing between the points B and C, the current can be seen to be greater than the sum of the majority and the minority currents, the latter being indicated by a dash line. Whenever this type of device is used, and in the application of such a characteristic curve to any circuit, it is desirable to have a high peak-to-valley current ratio. Nonetheless, in specifying a specific diode for production requirements, it is important that a rigid control be established on the peak current since this is usually determined by an etching process.

The peak voltage and the valley voltage and the forward voltage are all determined by the semi-conductor material and are consequently reasonably constant. For purposes of illustration, typical voltages which may be considered from the standpoint of operation may be represented by the following table:

TYPICAL TUNNEL DIODE VOLTAGES

| | Germanium, mv. | Silicon, mv. | Galium Arsenide, mv. |
|---|---|---|---|
| Peak Voltage ($V_p$) | 55 | 150 | 100 |
| Valley Voltage ($V_v$) | 350 | 460 | 450 |
| Forward Voltage ($V'_f$) | 500 | 820 | 1,000 |

With the foregoing brief explanation concerning operation, reference may be made now to FIG. 2 of the drawings in which a typical input signal may be applied between the terminals 12 and 13, of which the latter is normally considered grounded, as at 14. The signal input may be a wave which varies irregularly between minimum and maximum values. This input voltage is then applied through the indicated circuit which may be considered as a squaring circuit. This is a natural application because the tunnel diode provides a bistable operation together with excellent temperature stability, and can be regarded as generally insensitive to changes in the operating parameters of the transistor with which it is associated. The tunnel diode, as can be determined from the curve of FIG. 1, is inherently a regenerative device due to its negative resistance characteristic. It has a large closed loop gain-bandwidth product which presents an extremely small delay time. Owing to its inherent stability, it presents only an extremely small time jitter, in the region of only a few nanoseconds (a time period which is considerably shorter than the normal vacuum tube).

The input signal which is supplied at terminals 12 and 13 is then fed through a resistor 16 to a transistor 18 by the connection indicated to its base 20. The transistor 18 has voltage applied to its collector electrode 26 from a terminal 23 through the load resistor 28. In the circuit arrangement of FIG. 2, the emitter 24 is grounded, as indicated. Output signals are derived at the output terminals 34 and 13' connected across the load circuit resistor 28. The tunnel diode 32 is connected between the transistor base 20 and ground 14.

If reference is now made to FIG. 3, the operation of the typical emitter base junction operation is illustrated. If the tunnel diode characteristic (such as FIG. 1) is superimposed upon the characteristic of the emitter base diode (to which characteristic the legend is applied), the resultant input voltage may be noted. With the diagram of FIG. 3, the load line between the points C and D likewise becomes apparent. With increases in the magnitude of the input voltage (negative going for an P-N-P transistor but positive going for an N-P-N transistor) there will be an increase in current through the resistor 16. A corresponding increase in current will occur through the tunnel diode 32, that is, the point of operation on the resultant characteristic curve will move from the point of origin toward and through point A. Any further increase in voltage will cause the point of variation to change to point B. This will continue in a similar manner until point C is reached. The load lines then, as indicated, will be the lines passing through the points A, B and C. The slope of these load lines will all be constant and, as shown, the lines are all load lines drawn parallel. This is because it may be assumed that the value of the resistor 16 remains constant.

Whenever the current through the resistor 16 increases above that required at point C, a current division takes place. The result is that the point of operation of the diode is shifted immediately to point D so that a portion of the current now flows through the diode 32 and a portion flows through the emitter base junction of the transistor 18. For this condition, the transistor emitter-base-junction is forward biased and the result is that the transistor is carried to a conducting state. The base current resulting is sufficient to cause the transistor 18 to carry to a condition of saturation, whereupon the output voltage falls to approximately zero (0) volts (the actual voltage, of course, being determined by the saturation resistance of the specific transistor selected). Any further increase in the output voltage will only serve to increase the base drive current of the transistor 18 and therefore decrease the saturation voltage.

Whenever the input signal voltage causes a sufficient current to flow to place the point of operation between point A and the point C, the transistor 18 remains in an off condition. This fact can be verified in test by observing that the voltage is less than or equal to the peak voltage, such as that illustrated, for instance, by the above table. This voltage is insufficient to cause an appreciable base drive current to flow in the transistor. Then, as the output signal causes the point of operation to change abruptly from point C to point D, the base drive voltage likewise changes rapidly and will be approximately that indicated by the table, which is of sufficient value to cause conduction of the base drive current in the base emitter diode of transistor 18.

Whenever the input voltage is decreased in magnitude, that is, changing from some point such as E on the resultant curve toward the point D, no change occurs in the transistor voltage output until the incoming signal reduces the current to that which is obtainable at the point F. At this condition, the point of operation instantly changes to the point G and current no longer divides between the tunnel diode 32 and the base 20 of the transistor 18. Now, almost all of the current will flow through the tunnel diode. This means that the emitter-base voltage is reduced from somewhere in the range of about 300 mv. (as per the figure) to a value below 50 mv. with the result that the transistor is turned off.

The circuit as above-described thus becomes dependent upon the input voltage level and, with the attainment of an established voltage level, the output voltage switches rapidly from one binary state to another. It can be shown that a pre-established so-called "dead band" or hysteresis does exist. This, however, can be taken care of and made extremely small by reducing the size of the resistor 16, as becomes necessary.

Where it is desired to increase the input impedance of the circuit, modified forms of circuitry may be utilized. Illustrative of this is the circuit of FIG. 4 where the emitter follower is used to drive the tunnel diode squaring amplifier 31. In making reference to FIG. 4, the input signal is applied to the input terminals 11 and 13 and is fed in at the base 17 of the transistor 15. Transistor 15 has its emitter 19 supplied with voltage from a suitable source (not shown) connected with its negative terminal at the terminal point 23 and through resistor 25 to the emitter element 19. The collector 21 is grounded, as indicated. In this form of circuit, the output of the emitter follower 15 is supplied through resistor 27 to the base 33 of the transistor 31 which has its collector 37 supplied with negative potential through the output resistor 39. The emitter 35 is grounded.

The tunnel diode 41 connects in a fashion similar to that described in connection with the circuit of FIG. 2.

Output signals are available at the output terminals 43, 13'.

If reference is now made to FIG. 5, it will be observed that, circuit-wise, the components are generally similar to those explained with respect to FIG. 4 except that transistor 15 is now connected in a grounded emitter fashion with its collector electrode 21' connected to one end of the load resistor 25' and the output signal is then supplied through the resistor 27 to the base 33 of the transistor 31. The tunnel diode 41 is connected in a similar fashion to showing and modification of FIG. 2. In this arrangement, the input signal will not be inverted as would be the case with the arrangement of FIG. 4.

Further, for considerations where signal inversion is not desired and the input signals are supplied in accordance with the circuitry of FIG. 4, the signal output available from the transistor 31 may, as shown by FIG. 6, be supplied through the resistor 45 and speed-up capacitor 46 to the base 53 of a further amplifying transistor 51. In this instance, a positive voltage is supplied from a terminal 49 through biasing resistor 47 to the base 53. The emitter 55 is grounded as already explained and the collector 57 has negative voltage supplied to it from the source connected to the terminal 23 feeding through the load resistor 59. Subsequently squared output signals of a polarity corresponding to those supplied to the input terminals 11 and 13 are then available across the output terminals 61 and 13'.

The inverting stage of FIG. 5 represented by the transistors 15 and 51 may be operated either as a Class A or a Class C amplifying device. With the modification of FIG. 6, the tunnel diode squaring circuit is followed by the inverting stage.

Making reference now to FIG. 7, a further modification is shown where the tunnel diode 41, which has a low peak voltage, is connected to one end of the input resistance 16 and to ground. In this instance, it is assumed that the output pulse formation (as would be obtained with the circuit of FIG. 2) is generally satisfactory. While tunnel diode 41 connects between one end of resistor 16 and ground 14, the showing of FIG. 2 is modified to the extent that base electrode of the transistor 18 is isolated from the input with respect to D.C. by the capacitor 67 and positive voltage is supplied to the base from a terminal point 71 through the biasing resistor 73.

The circuitry of all of FIGS. 2 and 4 through 7 is such that a bistable output is derived from input signal voltages of generally any character such as analog, video, sine-wave, triangular-wave or the like. The squaring amplifiers in the form of the transistors 18 and 31, illustatively, are D.C. sensitive circuits which provide output signal voltages of rectangular wave form wherein a high input impedance which is constant over a wide frequency range is provided.

The switching speed is extremely high and, consequently, the rise time for the described circuit is considerably faster than with circuitry heretofore used, as far as applicant is aware, for such purpoess. Illustratvie of this is the fact that only six separate circuit components are required to achieve the end result as becomes particularly apparent from the illustrative showings of any of FIGS. 4, 5 and 6 by way of example. The circuitry is also extremely compact and of such form that it may readily be applied to many and various forms of circuits for achieving the desired end result.

Having now described the invention, what is claimed and desired to be secured by a Letters Patent is the following:

1. A squaring amplifier comprising a first transistor connected to have signal wave forms of varying amplitude applied thereto, a grounded emitter switching transistor, resistance means to connect the base of the switching transistor to receive output signals from the first transistor, and a tunnel diode having two electrodes, one of said electrodes being connected directly to the junction of the resistance means and the transistor base and its other electrode connected to a point of fixed potential to place the diode across the input circuit to said switching transistor and across the output circuit of the first transistor thereby to control current flow through the switching transistor, the said current flow being through the tunnel diode and first transistor for one signal level and through both transistors for a second signal level with an abrupt transition between the two levels.

2. A flip-flop amplifier circuit comprising an emitter-follower transistor adapted to have signal wave forms of varying amplitude applied thereto, an amplifying switching transistor having a grounded emitter connected to receive output signals from the first transistor, a control resistor directly connecting the output of the first transistor to the switching transistor and a tunnel diode connected between one terminal of the resistor and the base of the switching transistor on one hand and to a point of fixed potential on the other hand to place it across the input circuit to said switching transistor and across the output circuit of the first transistor thereby to control current flow through the switching transistor, the said current flow being through the tunnel diode and first transistor for one signal level and through both transistors for a second signal level with an abrupt transition between the two levels, the trip point being established by the selected control resistor.

3. A bi-stable squaring amplifier circuit comprising a first transistor connected to have signal wave forms of varying amplitude applied thereto, an amplifying switching transistor having its emitter grounded, a level setting resistance element for directly connecting the output of the first transistor to the input of the switching transistor to supply the output signals from the first transistor to the switching transistor, and a tunnel diode connected with its cathode connected to the junction of the level setting resistor and the base of the switching transistor and its anode connected to a point of fixed potential so that said tunnel diode is across the output circuit of the first transistor and the input to the switching transistor to control current flow therethrough, the said current flow being through the tunnel diode and first transistor for one signal level and through both transistors for a second signal level determined by said resistor with an abrupt transition occurring between the two levels.

References Cited in the file of this patent

International Solid-State Circuits Conference, "High Speed Switching Circuitry Using Tunnel Diodes," by Harrison & Foote, Feb. 16, 1961, pages 76–77.

IBM Technical Disclosure Bulletin, "Using Esaki Diode Latches," by Akmenkalns, January 1961, pages 38 and 39.

Nuclear Instruments and Methods 13 (1961), pages 197–200, North-Holland Publishing Co., "100 mc./s. TD Discriminator and Pulse Shaper," by Palmai et al.